US010868145B2

(12) United States Patent
Bian

(10) Patent No.: US 10,868,145 B2
(45) Date of Patent: Dec. 15, 2020

(54) VDMOS DEVICE AND MANUFACTURING METHOD THEREFOR

(71) Applicant: CSMC TECHNOLOGIES FAB2 CO., LTD., Jiangsu (CN)

(72) Inventor: Zheng Bian, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 70 days.

(21) Appl. No.: 16/329,656

(22) PCT Filed: Aug. 9, 2017

(86) PCT No.: PCT/CN2017/096595
§ 371 (c)(1),
(2) Date: Feb. 28, 2019

(87) PCT Pub. No.: WO2018/040865
PCT Pub. Date: Mar. 8, 2018

(65) Prior Publication Data
US 2019/0198644 A1      Jun. 27, 2019

(30) Foreign Application Priority Data

Aug. 31, 2016  (CN) .......................... 2016 1 0798447

(51) Int. Cl.
*H01L 29/66*  (2006.01)
*H01L 29/78*  (2006.01)
(Continued)

(52) U.S. Cl.
CPC ........ *H01L 29/66734* (2013.01); *H01L 21/28* (2013.01); *H01L 29/423* (2013.01);
(Continued)

(58) Field of Classification Search
CPC ......... H01L 29/66712–66734; H01L 29/4236; H01L 29/4238; H01L 29/78; H01L 29/7831; H01L 29/7802–7815
See application file for complete search history.

(56) References Cited

U.S. PATENT DOCUMENTS

2010/0123188 A1   5/2010  Venkatraman
2011/0233659 A1*  9/2011  Tai .................... H01L 29/66734
                                                             257/330
(Continued)

FOREIGN PATENT DOCUMENTS

CN       101866923 A    10/2010
CN       102097378 A     6/2011
(Continued)

OTHER PUBLICATIONS

International Search Report issued for International Patent Application No. PCT/CN2017/096595, dated Oct. 26, 2017, 5 pages including English translation.
(Continued)

*Primary Examiner* — Tucker J Wright
(74) *Attorney, Agent, or Firm* — Hamre, Schumann, Mueller & Larson, P.C.

(57) ABSTRACT

A VDMOS device and a manufacturing method therefor. The method comprises: forming a groove in a semiconductor substrate, wherein the groove comprises a first groove area, a second groove area and a third groove area communicating with the first groove area and the second groove area, and the width of the first groove area is greater than the widths of the second groove area and the third groove area; forming an insulation layer on the semiconductor substrate; forming a first polycrystalline silicon layer on the insulation layer; removing some of the first polycrystalline silicon layer; the first polycrystalline silicon layer forming in the first groove being used as a first electrode of a deep gate;
(Continued)

removing all the insulation layer located on the surface of the semiconductor substrate and some of the insulation layer located in the groove; forming a gate oxide layer on the semiconductor substrate; forming a second polycrystalline silicon layer on the gate oxide layer; removing some of the second polycrystalline silicon layer; and the second polycrystalline silicon layer forming in the groove being used as a second electrode of a shallow gate.

10 Claims, 6 Drawing Sheets

(51) Int. Cl.
*H01L 21/28* (2006.01)
*H01L 29/423* (2006.01)
(52) U.S. Cl.
CPC .......... *H01L 29/4236* (2013.01); *H01L 29/78* (2013.01); *H01L 29/7802* (2013.01); *H01L 29/7813* (2013.01); *H01L 29/7831* (2013.01)

(56) References Cited

U.S. PATENT DOCUMENTS

| | | |
|---|---|---|
| 2011/0275187 A1 | 11/2011 | Chen et al. |
| 2014/0027845 A1 | 1/2014 | Kobayashi |
| 2014/0167145 A1 | 6/2014 | Ichinoseki |
| 2016/0064556 A1 | 3/2016 | Qin et al. |

FOREIGN PATENT DOCUMENTS

| | | |
|---|---|---|
| CN | 103236439 A | 8/2013 |
| DE | 102006026943 | 12/2007 |
| EP | 2339636 | 6/2011 |

OTHER PUBLICATIONS

Extended European Search Report issued for European Patent Application No. 17845167.0, dated Mar. 3, 2020, 9 pages.

* cited by examiner

VDMOS DEVICE AND MANUFACTURING METHOD THEREFOR

TECHNICAL FIELD

The present disclosure relates to semiconductor manufacturing processes, and in particular to a Vertical Double-diffused Metal-Oxide Semiconductor (VDMOS) Field Effect Transistor device and a method for manufacturing the same.

BACKGROUND

At present, the technology of charge balance is introduced into the trench-type VDMOS products, and the structure of the split-gate device is something can be easily effected based on the existing technology. For split-gate technology, due to its dual gate design, which needs to be drawn to different electrodes (source and gate), the deep trench-like gate in the middle is connected to the source by way of connecting to the source metal through a direct punch-through, the shallow trench-like gate on the side is led out to the periphery of the active region and then punched out by way of increasing the polysilicon lithography layer. This requires additional polysilicon lithography to separate the two gates as compared to conventional trench-type VDMOS, thereby increasing processing costs, resulting that the leading-out of the shallow trench-like gate to be above the wafer plane and a certain step is formed, which affects the implementation of the subsequent process to some extent.

SUMMARY

Accordingly, it is necessary to provide a VDMOS device and a manufacturing method therefor that can realize the separate leading-out of the first and second electrodes of the gate without increasing the polysilicon lithography layers.

A method for manufacturing a VDMOS device includes:
forming a trench in a semiconductor substrate, the trench including a first trench region, a second trench region, and a third trench region communicating the first trench region and the second trench region, and a width of the first trench region is greater than widths of the second trench region and the third trench region;
forming an insulating layer on the semiconductor substrate, the insulating layer filling up the second trench region and the third trench region and being attached to a sidewall of the first trench region;
forming a first polysilicon layer on the insulating layer, the first polysilicon layer filling up the first trench region;
removing a portion of the first polysilicon layer until the insulating layer being exposed, and the first polysilicon layer formed in the first trench region serves as a first electrode serving as a deep gate;
removing all of the insulating layer on a surface of the semiconductor substrate and a portion of the insulating layer in the trench;
forming a gate oxide layer on the semiconductor substrate;
forming a second polysilicon layer on the gate oxide layer, the second polysilicon layer filling up the trench, the gate oxide layer isolating the first polysilicon layer and the second polysilicon layer; and
removing a portion of the second polysilicon layer until the gate oxide layer on the surface of the semiconductor substrate and on a top of the first polysilicon layer being exposed, and the second polysilicon layer formed in the trench serves as a second electrode serving as a shallow gate.

In addition, there is provided a VDMOS device includes:
a semiconductor substrate having a trench therein, the trench including a first trench region, a second trench region, and a third trench region connecting the first trench region and the second trench region; a width of the first trench region is greater than widths of the second trench region and the third trench region;
the first trench region being provided therein a first electrode serving as a deep gate formed of a first polysilicon layer, a second electrode serving as a shallow gate formed of a second polysilicon layer, an insulating layer, and a gate oxide layer, an upper portion of the first electrode is wrapped by the second polysilicon layer, and the first electrode and the second electrode are isolated by the gate oxide layer; and
the second trench region being provided therein a second electrode serving as a shallow gate formed of the second polysilicon layer, an insulating layer, and a gate oxide layer, the insulating layer is located below the second electrode, and the second electrode is wrapped by the gate oxide layer;
a top of the first electrode serving as a deep gate and a top of the second electrode serving as a shallow gate are coplanar.

In the manufacturing method for the VDMOS device, the separate leading-out of the first and second electrodes of the gate can be implemented without increasing the polysilicon lithography layers, while all the polysilicon gates remain in the trench. Therefore, there is no obvious step formed on the surface of the product, and the implementation difficulties of subsequent photolithography and etching process are somewhat reduced.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
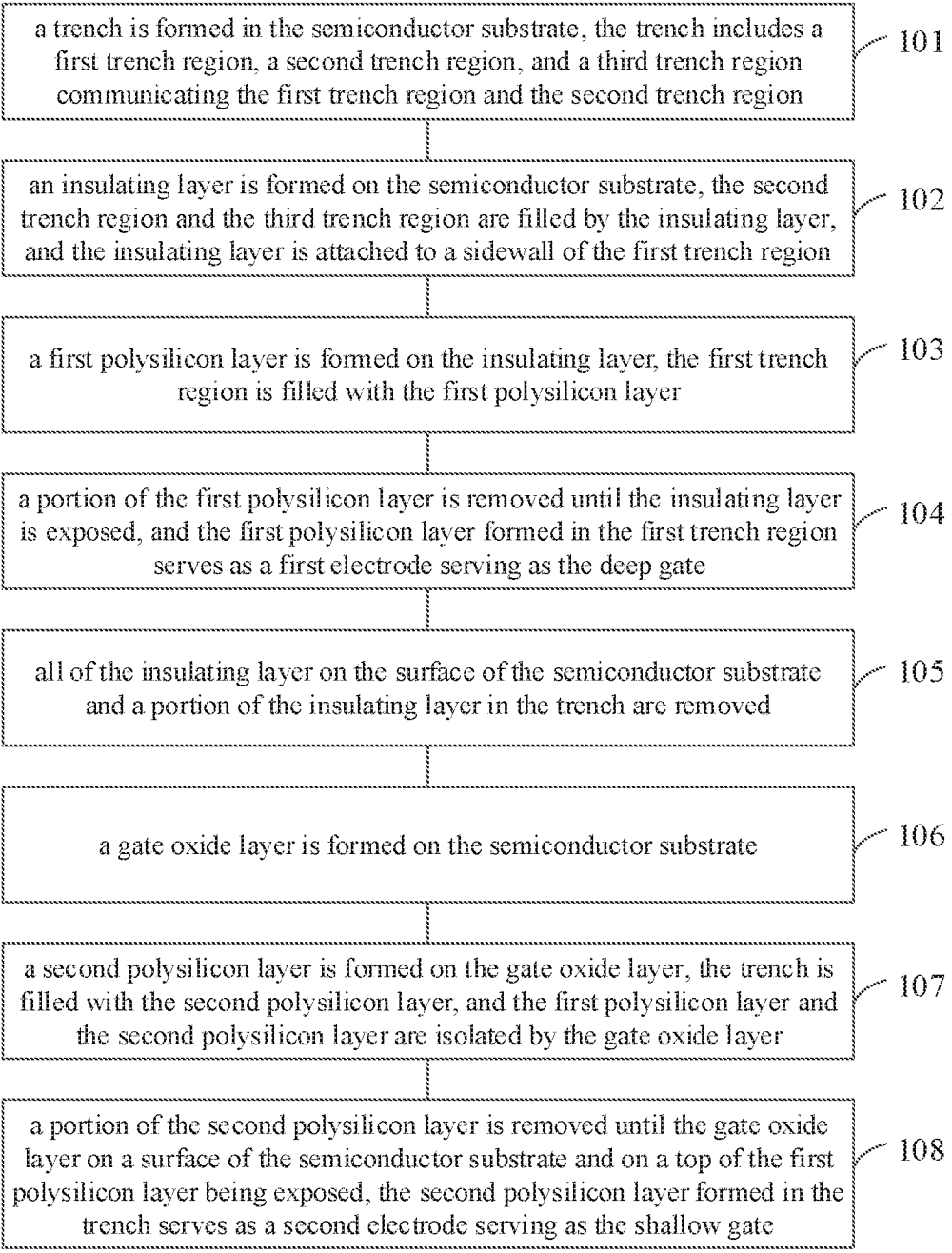
FIG. 1 is a flowchart of a method for manufacturing a VDMOS device according to an embodiment.

In order to address the deficiency of the prior split-gate technology, such as increasing the process cost and increasing the implementation difficulties of the subsequent processes, as shown in FIG. 1, according to an embodiment, a method for manufacturing a VDMOS device includes:

In step 101, a trench is formed in the semiconductor substrate, the trench includes a first trench region, a second trench region, and a third trench region communicating the first trench region and the second trench region.

Figure 2A:
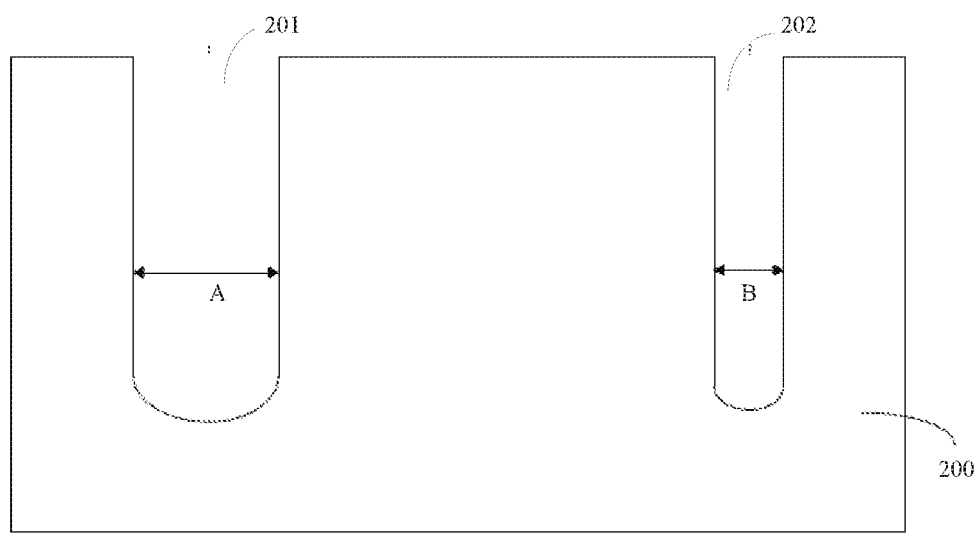
FIGS. 2A to 2F are cross-sectional views of the device respectively obtained by sequentially performing steps of a method according to an embodiment.

As shown in FIG. 2A, a semiconductor substrate 200 is provided, which can be composed of undoped monocrystalline silicon, monocrystalline silicon doped with impurities, Silicon on Insulator (SOI), Stacking Silicon on Insulator (SSOI), Stacking Silicon Germanium on insulator (S—SiGeOI), Stacking Silicon Germanium on Insulator (SiGeOI) and Germanium on Insulator (GeOI), etc. As an example, in the present embodiment, the semiconductor substrate 200 is composed of monocrystalline silicon. An isolation structure is formed in the semiconductor substrate 200, and as an example, the isolation structure is a shallow trench isolation (STI) structure or a local silicon oxide (LOCOS) isolation structure.

Next, a trench is formed in the semiconductor substrate 200. As shown in FIG. 3, the trench includes a first trench region 201, a second trench region 202, and a third trench region 213 communicating the first trench region 201 and the second trench region 202. The width of the first trench region 201 is greater than the widths of the second trench region 202 and the third trench region 213, and the width of the third trench region 213 is the same as or similar to the width of the second trench region 202. In the cross-sectional diagrams of FIGS. 2A to 2F, only the process in which the first trench region 201 and the second trench region 202 form a gate electrode is illustratively shown respectively, and the third trench region 213 is not shown in FIGS. 2A to 2F for brevity.

The first trench region 201 is in the cell region, and then a first electrode serving as a deep gate (cell gate) is formed in the first trench region 201, and a second electrode serving as a shallow gate (leading-out gate) is formed in the second trench region 202. The width A of the first trench region 201 is greater than the width B of the second trench region 202 to ensure that, after subsequent deposition of an insulating layer on the semiconductor substrate 200, the insulating layer fills up only the second trench region 202 and the third trench region 213.

The step of forming the trench includes forming a mask layer having the trench pattern on the semiconductor substrate 200. The mask layer may be formed using a conventional photolithography and etching process. The mask layer may have a single layer structure or a multi-layer structure. The mask layer having a single layer structure is a patterned photoresist layer, and the mask layer having a multi-layer structure may include a patterned advanced patterned layer, an anti-reflection coating layer, and a photoresist layer which are laminated from bottom to top. The semiconductor substrate 200 is etched using the mask layer as a mask, and the trench is formed in the semiconductor substrate 200. The etching may be an anisotropic dry etching. The mask layer is removed, and the mask layer is removed by an asking process; and a wet cleaning is performed to remove by-products and impurities generated by the foregoing etching.

In step 102, an insulating layer is formed on the semiconductor substrate, the second trench region and the third trench region are filled up by the insulating layer, and the insulating layer is attached to a sidewall of the first trench region.

Figure 2B:
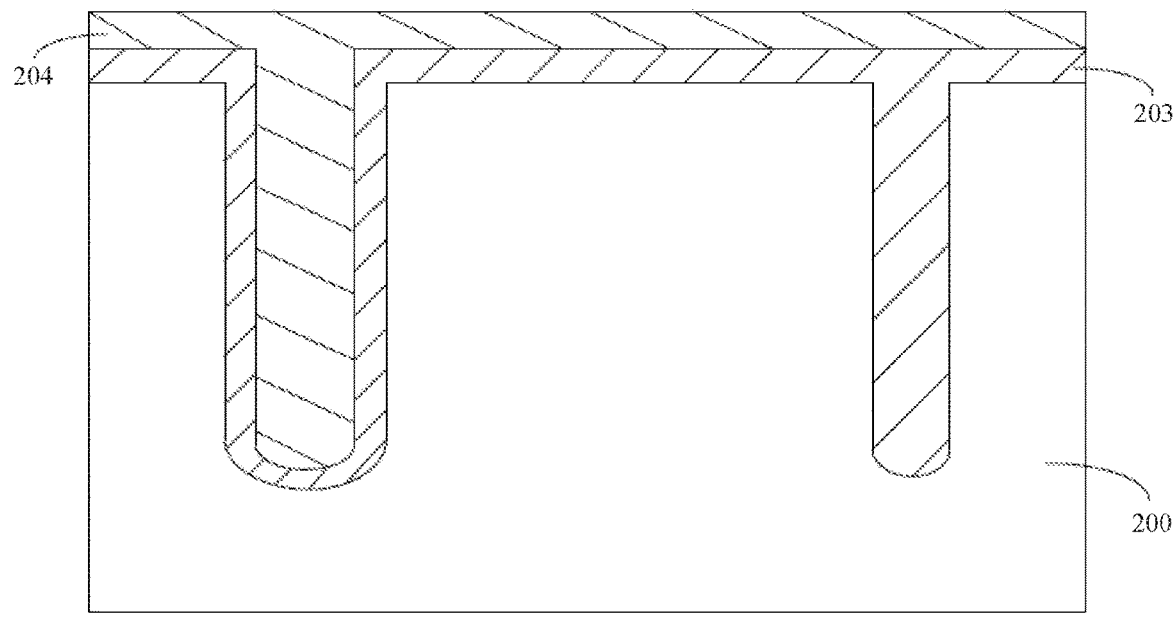
Figure 3:
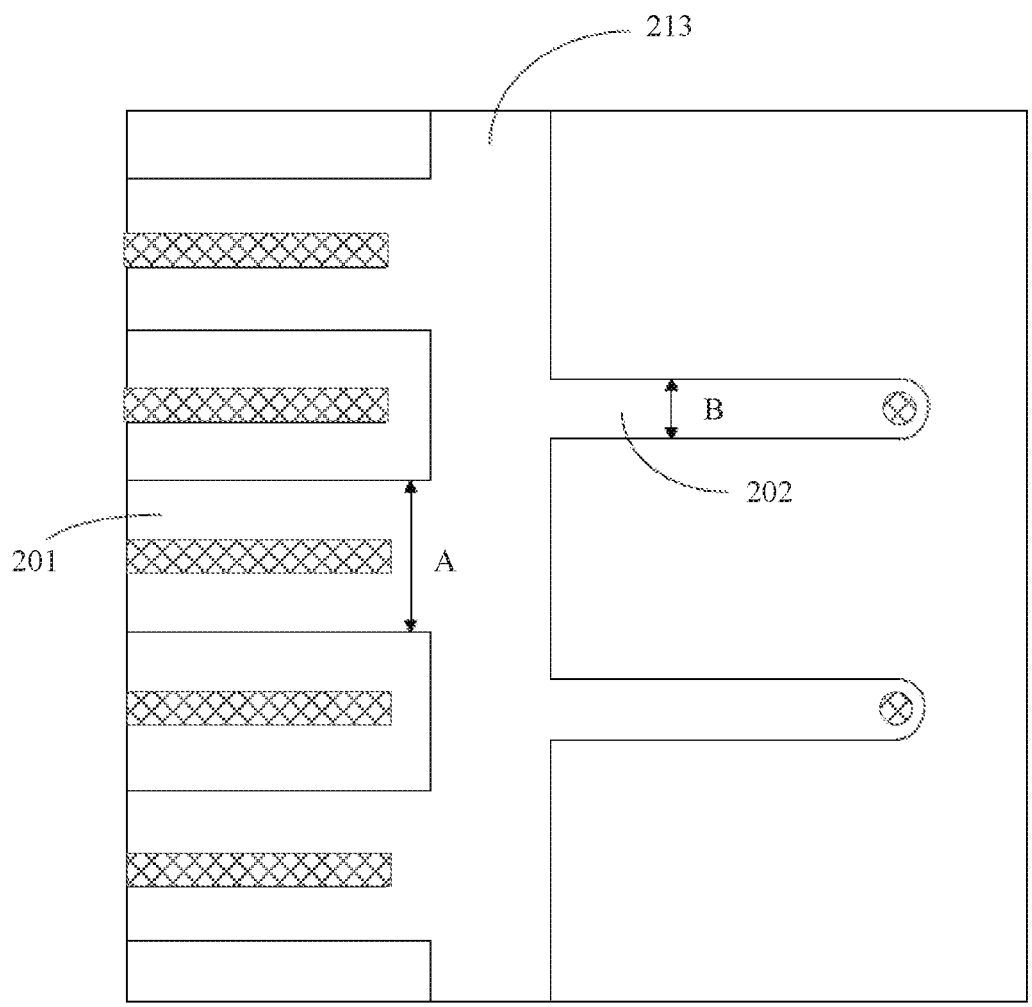
FIG. 3 is a schematic layout of a VDMOS device according to an embodiment.

As shown in FIG. 2B, an insulating layer 203 is formed on the semiconductor substrate 200 to ensure that the second trench region 202 and the third trench region are filled up. The insulating layer 203 is formed on the sidewall of the first trench region 201 but does not fill up the first trench region 201. The method of forming the insulating layer 203 may be any prior art known to those skilled in the art, such as deposition or oxidation growth processes, optionally Chemical Vapor Deposition (CVD), such as Low Temperature Chemical Vapor Deposition (LTCVD), Low Pressure Chemical Vapor Deposition (LPCVD), Fast Thermal Chemical Vapor Deposition (RTCVD), Plasma Enhanced Chemical Vapor Deposition (PECVD). The material of the insulating layer 203 includes an oxide, such as silicon dioxide.

In step 103, a first polysilicon layer is formed on the insulating layer, the first trench region is filled up with the first polysilicon layer.

As shown in FIG. 2B, a first polysilicon layer 204 is formed on the semiconductor substrate 200 to ensure that the first trench region 201 is filled up. Since the insulating layer 203 has filled up the second trench region 202 and the third trench region, the first polysilicon layer 204 can only enter the first trench region 201. The method of forming the first polysilicon layer 204 may be any prior art known to those skilled in the art, optionally CVD, such as LTCVD, LPCVD, RTCVD, and PECVD.

In step 104, a portion of the first polysilicon layer is removed until the insulating layer is exposed, and the first polysilicon layer formed in the first trench region serves as a first electrode serving as the deep gate.

Figure 2C:
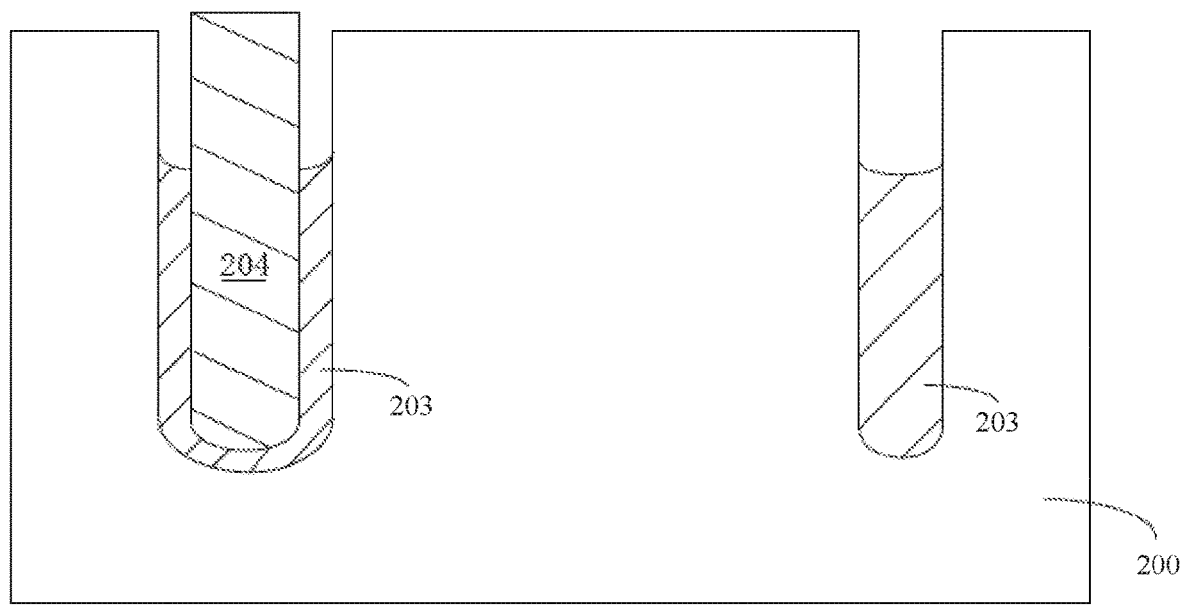

As shown in FIG. 2C, the excess first polysilicon layer 204 is removed until the insulating layer 203 is exposed. As an example, the excess first polysilicon layer 204 is removed using an etching process, which may be a wet etch. At this time, the first polysilicon layer 204 formed in the first trench region 201 constitutes a first electrode serving as a deep gate.

In step 105, all of the insulating layer on the surface of the semiconductor substrate and a portion of the insulating layer in the trench are removed.

As shown in FIG. 2C, the excess and exposed insulating layer 203 is removed to remove the insulating layer 203 on the surface of the semiconductor substrate 200. The removed thickness of the insulating layer 203 in the trench is the same as the thickness of the second electrode as a shallow gate formed later, and the thickness of the second electrode is determined according to the actual condition of the device structure, and is not particularly limited herein. As an example, the excess and exposed insulating layer 203 is removed using an etching process, which may be wet etching.

In step 106, a gate oxide layer is formed on the semiconductor substrate.

Figure 2D:
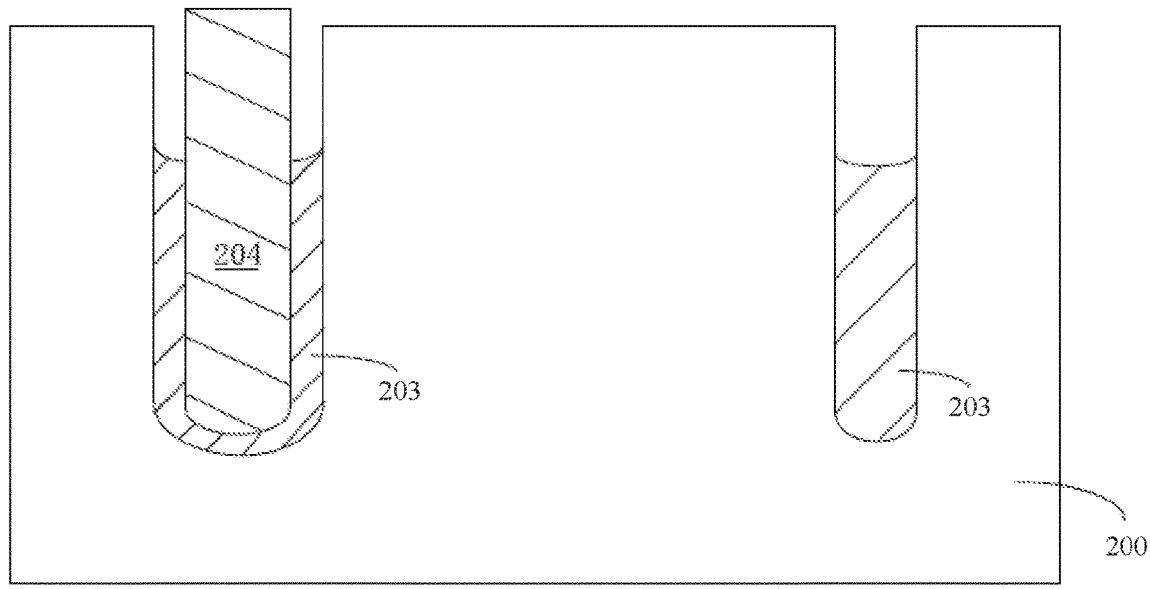

As shown in FIG. 2D, a gate oxide layer 205 is formed to achieve electrical insulation between the first polysilicon layer 204 and the subsequently formed second polysilicon layer 206. As an example, the gate oxide layer 205 is formed using a thermal oxidation or chemical oxidation process, the gate oxide layer 205 is on the surface of the semiconductor substrate 200, on the surface of the exposed first polysilicon layer 204, and on an exposed sidewall portion of the trench.

In step 107, a second polysilicon layer is formed on the gate oxide layer, the trench is filled up with the second polysilicon layer, and the first polysilicon layer and the second polysilicon layer are isolated by the gate oxide layer.

As shown in FIG. 2D, a second polysilicon layer 206 is formed on the semiconductor substrate 200 to ensure that the unfilled portion of the trench is filled up. The method of forming the second polysilicon layer 206 may be any prior art known to those skilled in the art, optionally CVD, such as LTCVD, LPCVD, RTCVD, and PECVD.

In step 108, a portion of the second polysilicon layer is removed until the gate oxide layer on a surface of the semiconductor substrate and on a top of the first polysilicon layer being exposed, the second polysilicon layer formed in the trench serves as a second electrode serving as the shallow gate.

Figure 2E:
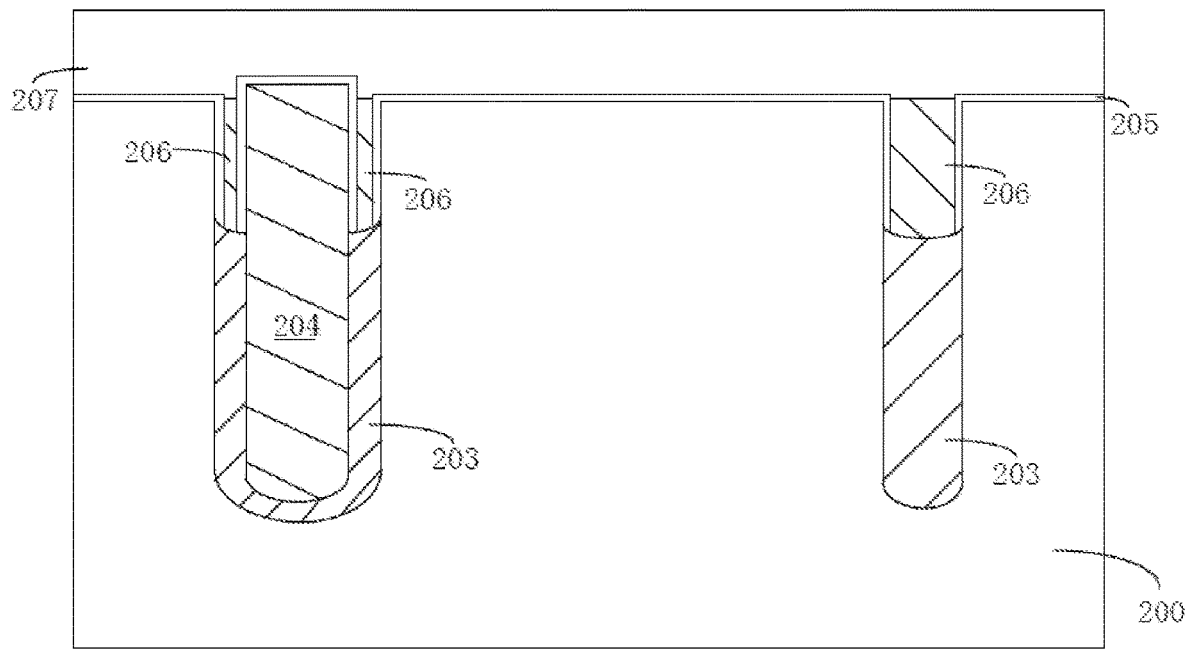

As shown in FIG. 2E, the excess second polysilicon layer 206 is removed until the gate oxide layer 205 on the surface of the semiconductor substrate 200 and on the top of the first polysilicon layer 204 is exposed. As an example, the excess second polysilicon layer 206 is removed using an etching process, which may be a wet etch. At this time, the second polysilicon layer 206 formed in the trench constitutes a second electrode serving as a shallow gate. At this time, the gate oxide layer 205 serves as an electrical insulating layer between the first polysilicon layer 204 and the second polysilicon layer 206.

Besides for forming the trench, the photolithography process is not used to forming the first electrode and the second electrode. The tops of the first electrode and the second electrode are coplanar, there is no height difference as a step, that is, there is no significant step on the surface of the semiconductor substrate 200 and will not affect the photolithography and etching process performed when the well region and the metal interconnecting layer are subsequently formed.

According to the method for manufacturing the VDMOS device according to the above embodiment, separate leading-out of the first and second electrodes of the gate can be achieved without increasing the polysilicon lithography layers, while all of the polysilicon gates remain in the trench. Therefore, there is no obvious step formed on the surface of the product, and the implementation difficulties of subsequent photolithography and etching process are somewhat reduced.

In an embodiment, the method for manufacturing the VDMOS device further includes forming a well region and a source region in the semiconductor substrate 200 through an ion implantation process. The process of forming the well region and the source region is known to those skilled in the art and is omitted for brevity herein.

In an embodiment, the method for manufacturing the VDMOS device further includes forming an interlayer dielectric layer 207 on the semiconductor substrate 200. As an example, the material of the interlayer dielectric layer 207 is optionally a material having a low dielectric constant. The materials having a low dielectric constant includes, but is not limited to, a Hydrogen Silsesquioxane (HSQ) having a k value of 2.5 to 2.9, a Methyl Silsesquioxane (MSQ) having a k value of 2.2, a Porous Silicon Dioxide formed by way of CVD etc. The interlayer dielectric layer 207 may be formed using any prior art known to those skilled in the art, optionally CVD, such as LTCVD, LPCVD, RTCVD, and PECVD etc.

Figure 2F:
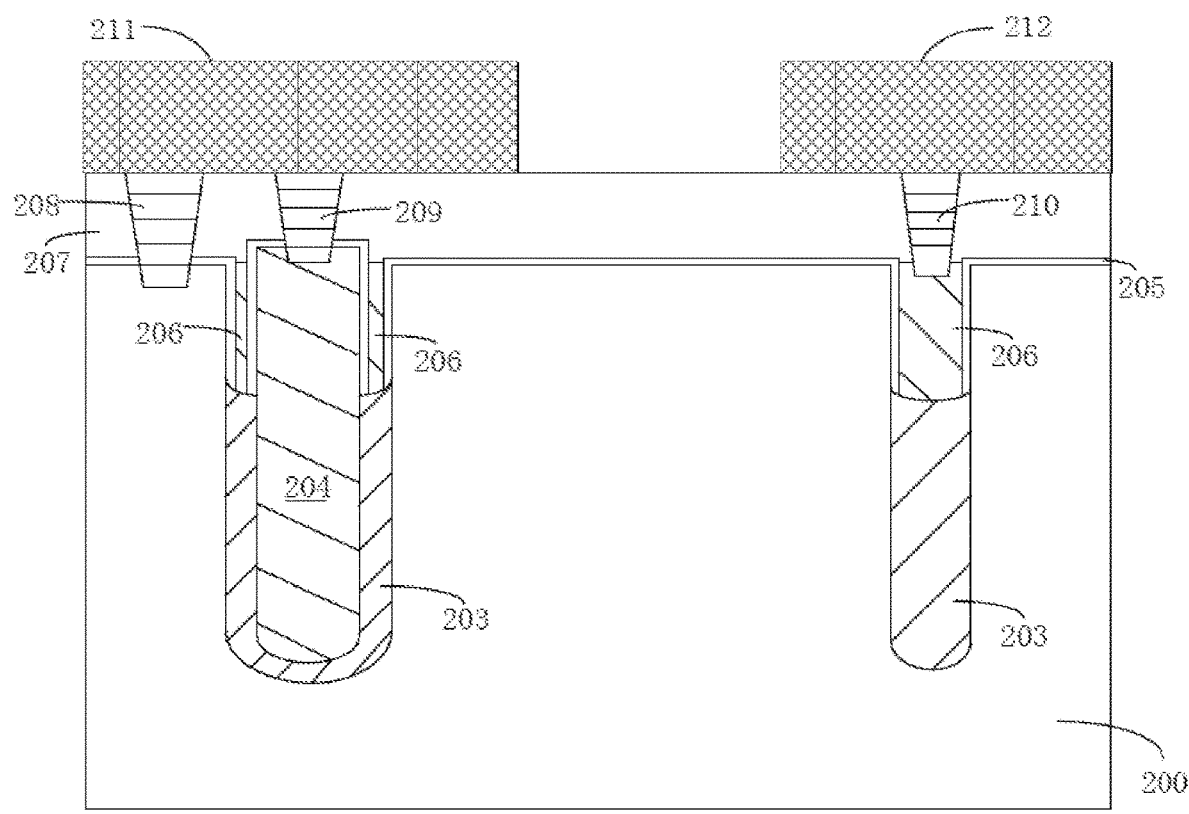

In an embodiment, as shown in FIG. 2F, the method for manufacturing the VDMOS device further includes forming a first contact plug 208, a second contact plug 209, and a third contact plug 210 penetrating the interlayer dielectric layer 207 by photolithography or an etching process. A bottom of the first contact plug 208 is electrically connected to a source region of the cell region. A bottom of the second contact plug 209 is electrically connected to the first polysilicon layer 204 in the first trench region 201. A bottom of the third contact plug 210 is electrically connected to the second polysilicon layer 206 in the second trench region 202. As an example, a mask layer having patterns of the first contact plug 208, the second contact plug 209, and the third contact plug 210 is formed on the interlayer dielectric layer 207, and the exposed interlayer dielectric layer 207 is etched using the mask layer as a mask. A via is formed in the interlayer dielectric layer 207 exposing the tops of the source region in the cell region, the first polysilicon layer 204 in the first trench region 201, and the second polysilicon layer 206 in the second trench region 202, after the mask layer is removed, a metal layer is filled up in the via to form the first contact plug 208, the second contact plug 209, and the third contact plug 210.

In an embodiment, the method for manufacturing the VDMOS device further includes forming a first metal layer 211 and a second metal layer 212 that are independent from each other located on the interlayer dielectric layer 207. The tops of the first contact plug 208 and the second contact plug 209 are electrically connected to the first metal layer 211, and the top of the third contact plug 210 is electrically connected to the second metal layer 212.

So far, the processing steps of the method according to an embodiment are completed. It will be appreciated that the method for manufacturing the VDMOS device includes not only the steps described above, but may include other desired steps prior to, among, or after the steps described above, all of which are included within the scope of the present method for manufacturing in the embodiments.

Compared with the prior art, according to the method for manufacturing the VDMOS device proposed in the above embodiments, the separation and leading-out of the first and second electrodes of the gate can be implemented without increasing the polysilicon lithography layers. Also, all polysilicon gates remain in the trench, so there is no obvious step formed on the surface of the product, and subsequent photolithography and etching processes are less difficult to implement.

As shown in FIG. 2F, in an embodiment, a VDMOS device is also provided including a semiconductor substrate 200 in which an isolation structure is formed. As an example, the isolation structure is a STI structure or a LOCOS isolation structure.

The semiconductor substrate 200 has a trench formed therein. The trench includes a first trench region, a second trench region, and a third trench region connecting the first trench region and the second trench region. The width of the first trench region is greater than the widths of the second trench region and the third trench region, and the width of the third trench region is the same as or similar to the width of the second trench region.

In the semiconductor substrate 200 required to form the VDMOS device and defined by the isolation structure, a first trench-like gate composed of the first polysilicon layer 204 and a second trench-like gate composed of the second polysilicon layer 206 are formed. The first trench-like gate constitutes a first electrode serving as a cell gate (deep gate), and the second trench-like gate constitutes a second electrode serving as a lead gate (shallow gate). A lower portion of the first trench-like gate is wrapped by an insulating layer 203, an upper portion of the first trench-like gate is wrapped by a second polysilicon layer 206, and a gate oxide layer 205 is formed between the first trench-like gate and the second trench-like gate to effect electrical insulation. An insulating layer 203 is formed below the bottom of the second trench-like gate.

Specifically, the first trench region is provided therein with a deep gate first electrode composed of a first polysilicon layer 204, a shallow gate second electrode composed of a second polysilicon layer 206, an insulating layer 203, and a gate oxide layer 207; the upper portion of the first electrode is wrapped by the second polysilicon layer 206, and the first electrode and the second electrode are isolated by the gate oxide layer 207. In the first trench region, the top of the first electrode serving as a deep gate and the top of the second electrode serving as a shallow gate are coplanar.

The second trench region is provided therein with a second electrode serving as a shallow gate formed by a second polysilicon layer 206, an insulating layer 203, and a gate oxide layer 207. The insulating layer 203 is located below the second electrode, and the second electrode is wrapped by the gate oxide layer 207.

In the VDMOS device, the separate leading-out of the first and second electrodes of the gate can be implemented without increasing the polysilicon lithography layers in the processing flow of the manufacturing process, and all the polysilicon gates in the VDMOS device remain in the trench, as such, the surface of the VDMOS device has no obvious step formed thereon, and the implementation difficulties of subsequent photolithography and etching processes are somewhat reduced.

In an embodiment, VDMOS device further includes an interlayer dielectric layer 207 located on the semiconductor substrate 200. The interlayer dielectric layer 207 is provided with a first contact plug 208, a second contact plug 209, and a third contact plug 210 whose bottoms are respectively and electrically connected to a source region in the cell region, a first trench-like gate in the cell region, and the second trench-like gate. That is, the bottom of the first contact plug 208 is electrically connected to the source region of the cell region; the bottom of the second contact plug 209 is electrically connected to the first polysilicon layer in the first trench region; and the bottom of the third contact plug is electrically connected to the second polysilicon layer in the second trench region.

In an embodiment, the VDMOS device further includes a first metal layer 211 and a second metal layer 212 that are independent from each other located on the interlayer dielectric layer 207. The tops of the first contact plug 208 and the second contact plug 209 are electrically connected to the first metal layer 211, and the top of the third contact plug 210 is electrically connected to the second metal layer 212.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A method for manufacturing a VDMOS device, comprising:
   forming a trench in a semiconductor substrate, the trench comprising a first trench region, a second trench region, and a third trench region communicating the first trench region and the second trench region, wherein a width of the first trench region is greater than widths of the second trench region and the third trench region;
   forming an insulating layer on the semiconductor substrate, the insulating layer filling up the second trench region and the third trench region and being attached to a sidewall of the first trench region;
   forming a first polysilicon layer on the insulating layer, the first polysilicon layer filling up the first trench region;
   removing a portion of the first polysilicon layer until the insulating layer being exposed, wherein the first polysilicon layer formed in the first trench region serves as a first electrode serving as a deep gate;
   removing all of the insulating layer on a surface of the semiconductor substrate and a portion of the insulating layer in the trench;
   forming a gate oxide layer on the semiconductor substrate;
   forming a second polysilicon layer on the gate oxide layer, the second polysilicon layer filling up the trench, the gate oxide layer isolating the first polysilicon layer and the second polysilicon layer; and
   removing a portion of the second polysilicon layer until the gate oxide layer on the surface of the semiconductor substrate and on a top of the first polysilicon layer being exposed, wherein the second polysilicon layer formed in the trench serves as a second electrode serving as a shallow gate.

2. The method according to claim 1, wherein a removed thickness of the insulating layer in the trench is the same as a thickness of the second electrode serving as the shallow gate.

3. The method according to claim 1, wherein the forming the gate oxide layer on the semiconductor substrate comprises: forming the gate oxide layer on an exposed sidewall of the trench and on the first polysilicon layer.

4. The method according to claim 1, wherein the insulating layer is formed using a deposition or oxidation growth process.

5. The method according to claim 1, wherein the removing is performed by a wet etching process.

6. The method according to claim 1, wherein after removing the portion of the second polysilicon layer, the method further comprises forming an interlayer dielectric layer on the semiconductor substrate.

7. The method according to claim 6, further comprising:
   forming a first contact plug, a second contact plug, and a third contact plug penetrating the interlayer dielectric layer, wherein a bottom of the first contact plug is electrically connected to a source region of the cell region; a bottom of the second contact plug is electrically connected to the first polysilicon layer in the first trench region; and a bottom of the third contact plug is electrically connected to the second polysilicon layer in the second trench region.

8. The method according to claim 7, further comprising forming a first metal layer and a second metal layer that are independent from each other located on the interlayer dielectric layer.

9. The method according to claim 8, wherein tops of the first contact plug and the second contact plug are electrically connected to the first metal layer, respectively, a top of the third contact plug is electrically connected to the second metal layer.

10. The method according to claim 1, wherein after removing the portion of the second polysilicon layer, the method further comprises forming a well region and a source region in the semiconductor substrate.

\* \* \* \* \*